(12) United States Patent
Ozawa et al.

(10) Patent No.: US 8,368,373 B2
(45) Date of Patent: Feb. 5, 2013

(54) CONTROL CIRCUIT OF POWER SUPPLY UNIT, POWER SUPPLY UNIT AND CONTROL METHOD THEREOF

(75) Inventors: Hidekiyo Ozawa, Kasugai (JP); Toru Nakamura, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1312 days.

(21) Appl. No.: 11/543,093

(22) Filed: Oct. 5, 2006

(65) Prior Publication Data

US 2007/0242557 A1      Oct. 18, 2007

(30) Foreign Application Priority Data

Mar. 24, 2006   (JP) .................................. 2006-083759

(51) Int. Cl.
G05F 1/00 (2006.01)
G05B 11/01 (2006.01)
G05D 3/12 (2006.01)
H02H 7/00 (2006.01)
H02J 3/00 (2006.01)

(52) U.S. Cl. ............ 323/283; 700/22; 700/297; 361/18; 307/82

(58) Field of Classification Search .................... 700/22, 700/297; 307/11–82; 365/185.18–227; 361/18; 323/282
See application file for complete search history.

(56) References Cited

U.S. PATENT DOCUMENTS

| | | | |
|---|---|---|---|
| 5,079,410 A * | 1/1992 | Payne et al. ................... | 219/506 |
| 5,426,347 A | 6/1995 | Nilssen | |
| 5,917,719 A * | 6/1999 | Hoffman et al. ................. | 363/84 |
| 5,949,671 A * | 9/1999 | Lee et al. ....................... | 363/142 |
| 5,964,879 A * | 10/1999 | Dunstan et al. ............... | 713/340 |
| 6,028,468 A | 2/2000 | Menniti et al. | |
| 6,459,175 B1 * | 10/2002 | Potega .......................... | 307/149 |
| 6,493,827 B1 * | 12/2002 | Mueller et al. ................ | 713/300 |
| 6,917,190 B2 | 7/2005 | Matsuo et al. | |
| 6,986,069 B2 * | 1/2006 | Oehler et al. .................. | 713/320 |

(Continued)

FOREIGN PATENT DOCUMENTS

| | | |
|---|---|---|
| CN | 1469216 A | 1/2004 |
| JP | 07-111314 A | 4/1995 |

(Continued)

OTHER PUBLICATIONS

Japanese Notification of Grounds for Rejection, English-language translation, mailed Jan. 25, 2011, for corresponding Japanese Application No. 2006-083759.
Japanese Office Action mailed Jul. 5, 2011 for corresponding Japanese Application No. 2006-083759, with English-language Translation.

*Primary Examiner* — Darrin Dunn
(74) *Attorney, Agent, or Firm* — Fujitsu Patent Center

(57) ABSTRACT

To provide a control circuit of power supply unit, power supply unit and control method thereof capable of setting and adjusting a voltage value of output voltage flexibly corresponding to an instruction from outside, a voltage adjusting portion AD for adjusting first voltage setting information inputted from outside to real voltage information is provided and the voltage value of the output voltage of the power supply unit is controlled based on real voltage information outputted from the voltage adjusting portion AD. The first voltage setting information inputted from outside enables a desired output voltage to be set up by adjusting the real voltage information flexibly even if information relating to the setting of voltage set as output voltage to an external device which is a supply destination is different from actually necessary voltage value.

14 Claims, 7 Drawing Sheets

DIAGRAM SHOWING CONNECTION BETWEEN POWER SUPPLY UNIT AND EXTERNAL DEVICE

U.S. PATENT DOCUMENTS

| | | |
|---|---|---|
| 7,443,147 B2 | 10/2008 | Kasai et al. |
| 2002/0101744 A1* | 8/2002 | DeMone .................... 363/59 |
| 2002/0163826 A1* | 11/2002 | Devlin et al. ............... 365/63 |
| 2003/0132668 A1* | 7/2003 | Lanni ........................ 307/38 |
| 2005/0088201 A1* | 4/2005 | Devlin et al. ............... 326/38 |
| 2005/0200622 A1* | 9/2005 | Yajima ...................... 345/211 |
| 2005/0218870 A1* | 10/2005 | Lys ............................ 323/222 |
| 2005/0218971 A1* | 10/2005 | Elfman ...................... 327/550 |
| 2006/0250830 A1* | 11/2006 | Lanni ........................ 363/80 |
| 2007/0178728 A1* | 8/2007 | Barrena et al. ............. 439/108 |
| 2007/0217108 A1 | 9/2007 | Ozawa et al. |
| 2009/0013199 A1* | 1/2009 | Leung et al. ............... 713/300 |
| 2009/0199204 A1* | 8/2009 | Frank ........................ 719/313 |

FOREIGN PATENT DOCUMENTS

| | | |
|---|---|---|
| JP | 07-176624 A | 7/1995 |
| JP | 2002-111470 A | 4/2002 |
| JP | 2002-112542 A | 4/2002 |
| JP | 2003-348826 A | 12/2003 |
| JP | 2006-074948 A | 3/2006 |
| KR | 10-2000-0074998 A | 12/2000 |
| TW | I309911 | 5/2009 |

* cited by examiner

DIAGRAM SHOWING CONNECTION BETWEEN POWER SUPPLY UNIT AND EXTERNAL DEVICE

FIG. 2 PRINCIPLE DIAGRAM OF PRESENT INVENTION

DIAGRAM SHOWING VOLTAGE ADJUSTING PORTION OF FIRST EMBODIMENT

FIG. 4  DIAGRAM SHOWING SECOND EMBODIMENT

FIG. 5 DIAGRAM SHOWING THIRD EMBODIMENT

FIG. 6 DIAGRAM SHOWING FOURTH EMBODIMENT

DIAGRAM SHOWING INTERFACE OF PRIOR ART

CONTROL CIRCUIT OF POWER SUPPLY UNIT, POWER SUPPLY UNIT AND CONTROL METHOD THEREOF

CROSS-REFERENCE TO RELATED APPLICATIONS

This application is based upon and claims the benefit of priority from the prior Japanese Patent Application No. 2006-083759 filed on Mar. 24, 2006, the entire contents of which are incorporated herein by reference.

BACKGROUND OF THE INVENTION

1. Field of the Invention

The present invention relates to a control circuit of power supply unit, a power supply unit and control method thereof, more particularly to a control circuit of power supply unit in which the voltage value of outputted voltage is controlled corresponding to an instruction from outside, a power supply unit and control method thereof.

2. Description of Related Art

In technical field of semiconductor device, reduction of the voltage of a power supply unit has been accelerated with intensified processing velocity and integration. However, it is considered that the voltage of the power supply unit demanded in each semiconductor device varies depending on a difference of development of manufacturing technology. When an interface is assured between different semiconductor devices in a system apparatus constituted of a combination of plural semiconductor devices, the voltage amplitude of I/O signals sometimes may be different. As an art for assuring an interface between the semiconductor devices having a different power supply voltage, the art exemplified in Japanese Unexamined Patent Publication No. 2002-111470 has been proposed.

FIG. 7 shows an example. A case of interfacing a control LSI 100 such as ASIC with a dynamic memory (hereinafter referred to as DDR memory) 200 which exerts DDR function is considered. For example, assume that the DDR memory 200 is actuated at power supply voltage Vdd2 of 2.5 V and 1.25 V which is half of the power supply voltage Vdd2 is set to the interface circuit as terminal voltage VTT. Contrary to this, assume that the control LSI 100 is actuated at a power supply voltage Vdd of 1.2 V.

In the DDR memory 200 having a high velocity interface circuit, the voltage amplitude width is limited to ±200 mV around the terminal voltage VTT (for example, 1.25 V) in order to suppress propagation delay of the signal. The maximum value of the interface signal is 1.45 V which is the terminal voltage VTT (1.25 V)+200 mV and this value exceeds 1.2 V, which is the power supply voltage Vdd of the control LSI 100.

Then, the low level side voltage of the control LSI 100 is set to a voltage raised relative to the ground to match the terminal voltage VTT (1.25 V) with the voltage of ½ the power supply voltage Vdd of the control LSI 100. That is, the low level side voltage of the control LSI 100 is set to 0.65 V and correspondingly, the power supply voltage is set to 1.85 V (=1.2 V+0.65 V). The interface signal vibrates in amplitude of 1.25 V±200 mV, so that the voltage amplitude width of the interface signal settles within the operating voltage range of the control LSI 100 thereby enabling direct interfacing with the DDR memory 200.

The electric characteristic and other physical properties of devices such as MOS transistor constituting the semiconductor device come likely to be affected by dispersion of production quality because of miniaturization of the semiconductor device accompanying the intensified processing velocity and integration, thereby sometimes leading to increase in the dispersion of production quality among individual semiconductor devices. It has been known that the electric characteristic and other physical properties of various devices change due to a difference in usage environment such as ambient temperature. Such changes in characteristic sometimes appear more conceivably due to influences of reduction in voltage for use and it is considered that sufficient characteristics cannot be secured under every usage environment.

While the reduction in voltage for use in the semiconductor device accompanying the miniaturization has been accelerated due to demand for intensification of operating velocity, it is necessary to suppress the threshold voltage to a low voltage in order to operate the MOS transistor at high velocity. However, the MOS transistor having a low threshold voltage can have such a characteristic that consumption current increases due to a leak current penetrating between its source and drain when it is not conductive. To reduce this leak current, it is considered to deepen the threshold voltage by applying a voltage bias to the back gate for the MOS transistor to exert back gate bias effect. That is, it comes that the low threshold voltage necessary for securing a characteristic of high speed operation conflicts with a high threshold voltage necessary for securing a characteristic of low consumption current.

Thus, when the semiconductor device is stopped, voltage bias of increasing the back gate bias effect is carried out to deepen the threshold voltage of the MOS transistor thereby reducing the current consumption by leak current as disclosed in Japanese Unexamined Patent Publication No. H7(1995)-176624. At operation time, the high-velocity operation is met by executing the voltage bias of reducing the back gate bias effect to shallow the threshold voltage of the MOS transistor. This is technology for satisfying both a high velocity response at the operation time and the low consumption current at standby time in the semiconductor device by dynamically controlling the voltage bias to the back gate of the MOS transistor.

SUMMARY OF THE INVENTION

To interface between semiconductor devices each having a different power supply voltage, a voltage raised relative to the ground is regarded as low level side voltage to use the threshold voltage of an interface signal commonly without adopting the low level side voltage which is a reference value of power supply voltage as a common ground, as disclosed in Japanese Unexamined Patent Publication No. 2002-111470.

However, a power supply voltage instructed from a system appliance or other controller as a power supply voltage necessary for the control LSI, which regards a voltage raised relative to the ground as its low level side voltage in this case, is generally information about a voltage value with respect to the ground. The reason is that regular power supply voltage is a voltage with respect to the ground. If the power supply unit is instructed based on this voltage value information, it cannot supply a predetermined voltage for either of the low level side voltage or the high level side voltage, so that there is a fear that a power which enables the interface disclosed in the Japanese Unexamined Patent Publication No. 2002-111470 cannot be supplied, which is a problem to be solved.

Further, the conflicting characteristics of the high velocity operation and low consumption current can be satisfied at the same time by changing the threshold voltage by changing a voltage bias to the back gate of the MOS transistor at the operation time and standby time, as disclosed in Japanese Unexamined Patent Publication NO. H7(1995)-176624.

However, the dispersion of processing quality, change in temperature and the like can turn to characteristic change different among individual semiconductor devices. An optimum voltage value can be different depending on the semiconductor device or operation condition. Although a voltage value adjustment function of adjusting a voltage value specified preliminarily corresponding to the operation characteristic has been demanded, the Japanese Unexamined Patent Publication No. H7 (1995)-176624 has not disclosed such a function, which is a problem to be solved.

Accordingly, the present invention has been achieved in views of the above-described prior art and an object of the invention is to provide a control circuit of power supply unit, power supply unit and control method thereof capable of setting and adjusting an output voltage flexibly corresponding to an instruction from outside.

In order to achieve the above object, there is provided a control circuit of power supply unit which controls a voltage value of output voltage corresponding to an instruction from outside, comprising:
a voltage adjusting portion which adjusts real voltage information corresponding to first voltage setting information inputted from outside or corresponding to the first voltage setting information and second voltage setting information set preliminarily, wherein
the voltage value of the output voltage is controlled based on the real voltage information outputted from the voltage adjusting portion.

There is also provided a power supply unit in which a voltage value of output voltage is controlled corresponding to an instruction from outside, comprising:
a voltage adjusting portion which adjusts real voltage information corresponding to first voltage setting information inputted from outside or corresponding to the first voltage setting information and second voltage setting information set preliminarily, wherein
the voltage value of the output voltage is controlled based on the real voltage information outputted from the voltage adjusting portion.

In the control circuit of power supply unit and power supply unit of the present invention, real voltage information is adjusted corresponding to first voltage setting information inputted from outside by the voltage adjusting portion or the real voltage information is adjusted corresponding to the first voltage setting information inputted from outside and second voltage setting information set preliminarily. The output voltage of the power supply unit is controlled based on adjusted real voltage information.

Further, there is provided a power supply unit in which a voltage value of output voltage is controlled corresponding to an instruction from outside, comprising:
a voltage adjusting portion which adjusts real voltage information corresponding to first voltage setting information inputted from outside or corresponding to the first voltage setting information and second voltage setting information set preliminarily, wherein
the voltage value of the output voltage is controlled based on the real voltage information outputted from the voltage adjusting portion.

According to the control method of the power supply unit of the present invention, the first voltage setting information is inputted from outside and the real voltage information is adjusted corresponding to the inputted first voltage setting information. Or, after the second voltage setting information is set preliminarily, the first voltage setting information is inputted from outside and the real voltage information is adjusted corresponding to the first and second voltage setting information. The output voltage from the power supply unit is controlled based on the adjusted real voltage information.

Consequently, even if information about voltage setting set as an output voltage to a supply destination by the first voltage setting information inputted from outside or/and the second voltage setting information predetermined is different from actually necessary voltage value, a desired output voltage can be set by adjusting the real voltage information flexibly.

It is sometimes preferable to adjust the voltage value for supply of the voltage by providing a specified voltage value with an offset or/and by adjusting the voltage value at a predetermined adjustment magnification corresponding to the circuit structure of an electronic device represented by a semiconductor device or system appliance constituted by combining the electronic devices or/and corresponding to dispersion of processing quality of the electronic device or system appliance or changes in operating characteristic due to usage environment. This is for optimization of the operation of the device. In this case also, real voltage information undergoing a predetermined adjustment can be outputted from the first and second voltage setting information given as information relating to the output voltage.

If specified value information of the output voltage is given to the control circuit of the power supply unit or the power supply unit as the first voltage setting information, the real voltage information inherent of each device can be adjusted easily. No necessity of inputting a voltage value inherent of each device from outside exists so that the control on the control circuit of the power supply unit and the power supply unit can be simplified. To set an inherent voltage value which is changed from a specified voltage value corresponding to each device, information about the voltage setting indicating an mount of the change from the specified voltage value can be inputted to the control circuit of the power supply unit or the power supply unit as the first voltage setting information. Consequently, a voltage which is different depending on each device can be outputted easily.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereinafter, the embodiment of the control circuit of power supply unit, a power supply unit and control method thereof according to the present invention will be described in detail with reference to FIGS. 1-6.

Figure 1:
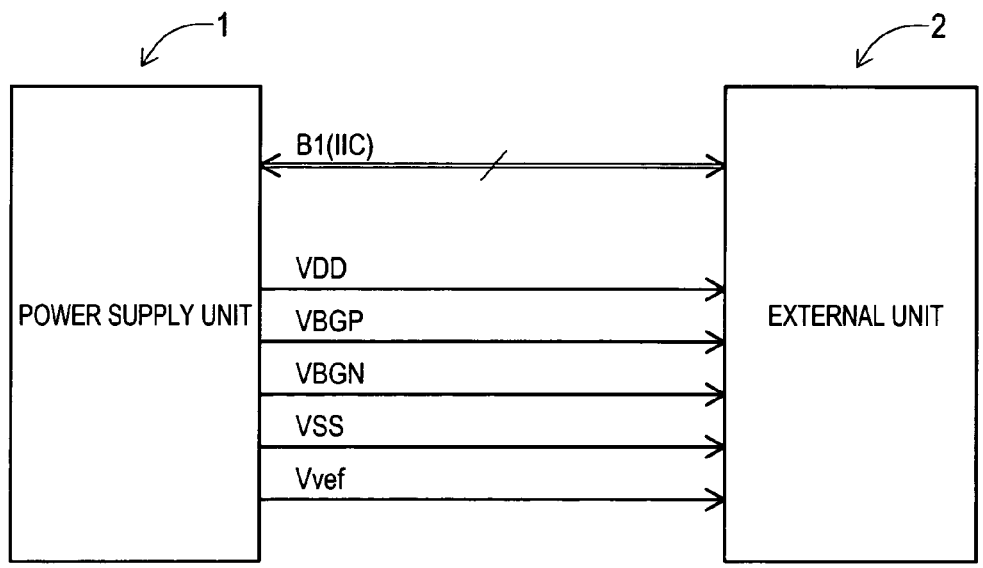
FIG. 1 is a diagram showing a connection between a power supply unit and an external device which receives a power.
Figure 7:
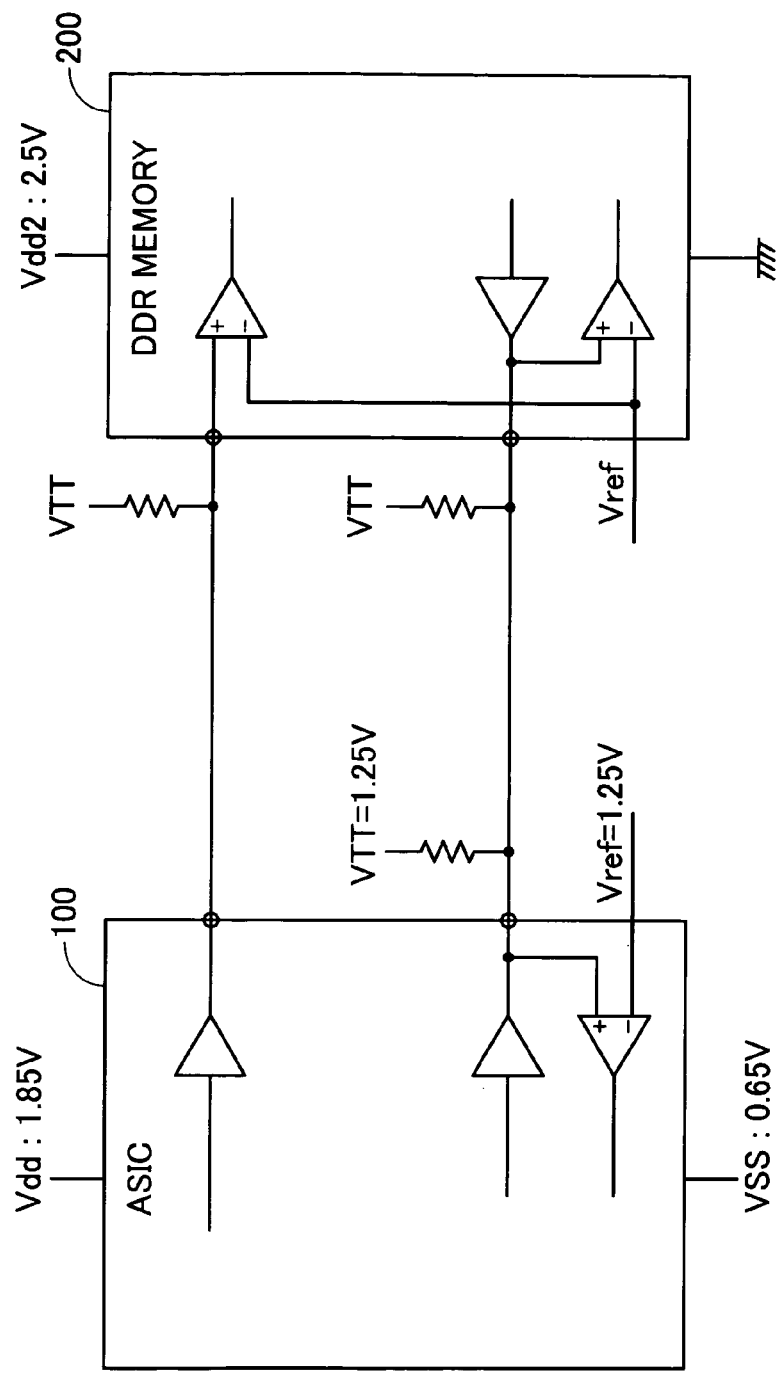
FIG. 7 is a diagram showing an interface between a control LSI and DDR memory of prior art.

FIG. 1 shows a connection relation between a power supply unit 1 of the present invention and an external unit 2 supplied with power from the power supply unit 1. As shown in the principle diagram of FIG. 2, the power supply unit 1 is loaded with a plurality of DC-DC converters 30-70, each of which supplies high level side power supply voltage VDD, low level side power supply voltage VSS, back gate voltages VBGP, VBGN of PMOS and NMOS transistor and reference voltage Vref for use in the threshold voltage and the like of interface signal to the external unit 2. The power supply unit 1 exchanges a variety of information with the external unit 2 through communication line such as IIC bus. The external unit 2 is constituted of MOS device including PMOS/NMOS transistor. The interface structure shown in FIG. 7 is also provided.

The various information mentioned here refers to first voltage setting information and the like relating to a power supply voltage and each voltage bias required by the external unit 2. The external unit 2 starts its action corresponding to supply of power from the power supply unit 1. Thus, the first voltage setting information which is sent from the external unit 2 through a communication line such as IIC bus needs to be sent in a transient state before the external unit 2 reaches a steady condition. It is considered that such provisional setting information can be sent and it may not be optimized voltage setting information which should be supplied. Or the sent information may be nominal voltage setting information different from the voltage value to be outputted.

For example, as the various information, the first voltage setting information based on the voltage specification of individual devices constituting the external unit 2 may be sent. In this case, the interface structure in which the low level side power supply voltage is different between devices a shown in FIG. 7 is not considered. Preferably, output voltage offset value information corresponding to the interface structure is added to the first voltage setting information sent from the power supply unit 1 so as to adjust real voltage information and then, the power is supplied to the device.

Preferably, the power supply unit 1 is equipped with optimum second voltage setting information having a relation with the first voltage setting information sent from the external unit 2.

It can be considered preferable that a voltage value different from a specified voltage value such as a center value of voltage range is supplied in order to obtain an optimum circuit action because of dispersion of devices constituting the external unit 2 or matching of the external unit 2. For example, it is convenient that real voltage information adjusted by predetermined voltage adjustment magnification information can be obtained to specified value information of output voltage by equipping the power supply unit 1 with voltage adjustment magnification information as the second voltage setting information if the first voltage setting information to be sent is the specified value information of the output voltage or the power supply unit 1 with the specified value information of output voltage as the second voltage setting information if the first voltage setting information to be sent is predetermined voltage adjustment magnification information.

If a predetermined voltage relation, for example, between the high level side power supply voltage VDD and the back gate voltage VBGP of the PMOS transistor or between the low level side power supply voltage VSS and the back gate voltage VBGN of the NMOS transistor needs to be maintained, it is convenient if a specified adjustment can be done in the power supply unit 1.

In a following description, a method for adjusting the real voltage information in order to output an accurate voltage value to the external unit 2 based on a variety of the first voltage setting information sent from the external unit 2 and further the second voltage setting information stored preliminarily as required will be exemplified in the first to fourth embodiments.

Figure 2:
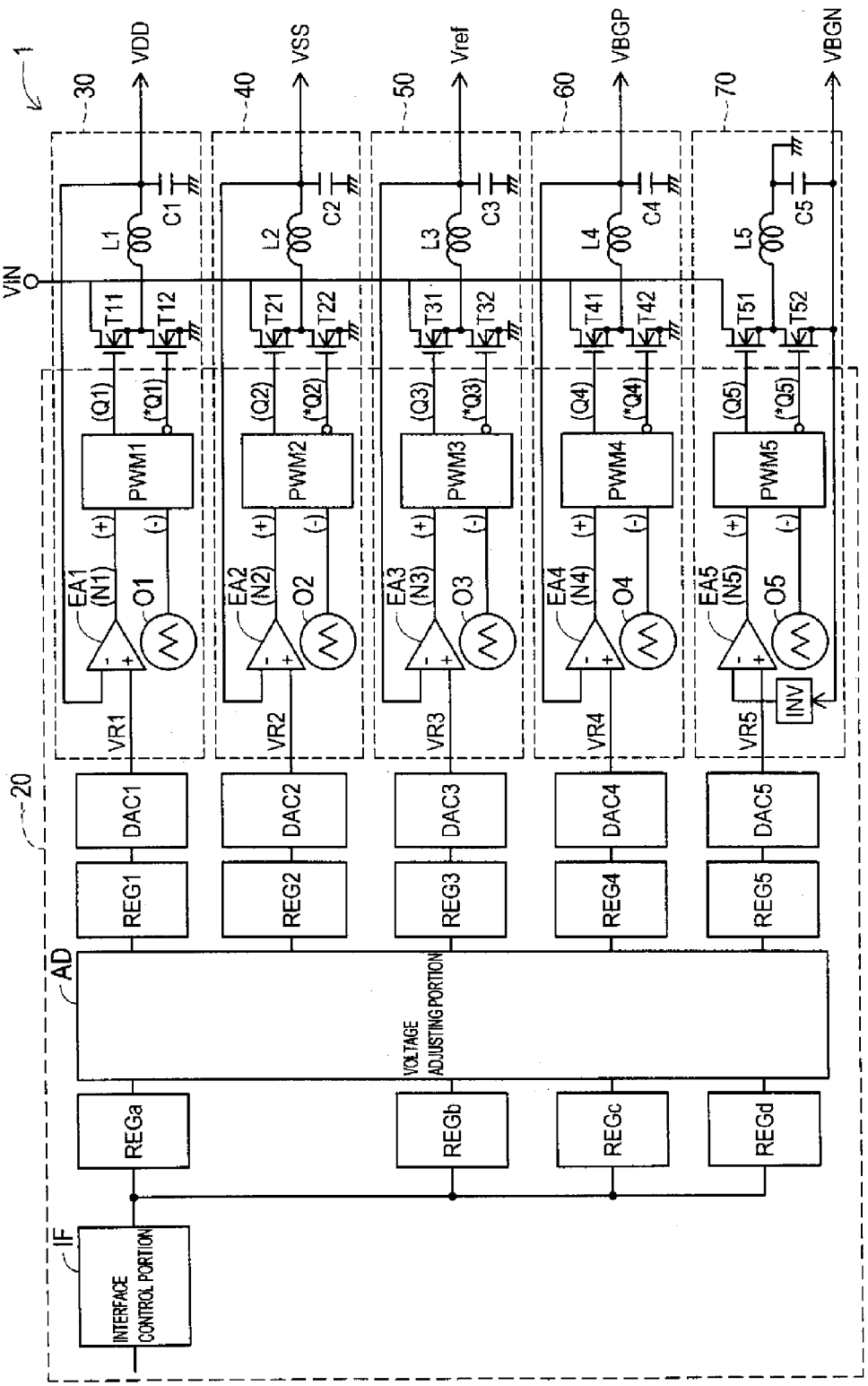
FIG. 2 is a principle diagram of the present invention.

FIG. 2 is a principle diagram of the present invention. The power supply unit 1 is constituted of first-fifth DC-DC converters 30 to 70. Setting voltages VR1-VR5 which set the voltage values of output voltages VDD, VSS, Vref, VBGP and VBGN of the first-fifth DC-DC converters 30 to 70 are determined based on the first voltage setting information sent from the external unit 2 through IIC bus. It includes an interface control portion IF, registers REGa-REGd, voltage adjusting portion AD, register REG1-REG5, and DA converters DAC1-DAC5. Here, the first-fifth DC-DC converters 30-70 are constituted as well as the interface control portion IF, the registers REGa-REGd, voltage adjusting portion AD, register REG1-REG5, and DA converters DAC1-DAC5. The control circuit 20 of the power supply unit 1 is constituted by equipping error amplifiers EA1-EA5, triangular wave oscillators O1-O5 and PWM comparators PWM1-PWM5.

An input terminal of the interface control portion IF is connected to the IIC bus. This IIC bus is connected to the external unit 2 and the first voltage setting information is sent from the external unit 2. Output terminals of the interface control portion IF are connected to the registers REGa-REGd.

The registers REGa-REGd are connected to the voltage adjusting portion AD. The first voltage setting information sent from the external unit 2 is adjusted to each real voltage information for the first-fifth DC-DC converters 30-70. The voltage adjusting portion AD is connected to the registers REG1-REG5 and the registers REG1-REG5 are connected to the DA converters DAC1-DAC5. The DA converters DAC1-DAC5 are connected to the first-fifth DC-DC converters 30-70. The real voltage information adjusted by the voltage adjusting portion AD is stored in the registers REG1-REG5, DA converted by the DA converters DAC1-DAC5 and then the setting voltages VR1-VR5 are outputted.

The first DC-DC converter 30 supplies the high level side power supply voltage VDD to the external unit 2 and includes a main switching transistor T11, a synchronous side switching transistor T12, a choke coil L1, and a capacitor C1. In the main switching transistor T11, input voltage VIN is supplied to its drain. The source of the main switching transistor T11 is connected to the drain of the synchronous side switching transistor T12. The source of the synchronous switching transistor T12 is connected to the ground. Further, the source of the main switching transistor T11 and the drain of the synchronous switching transistor T12 are connected to an end of the choke coil L1. The other end of the choke coil L1 is an output terminal which outputs the high level side power supply voltage VDD. And, a capacitor C11 is connected between an output terminal and the ground.

The first DC-DC converter 30 includes the error amplifier EA1, the triangular wave oscillator O1 and the PWM comparator PWM1. The inverting input terminal of the error amplifier EA1 is connected to the output terminal. On the other hand, the non-inverting input terminal of the error amplifier EA1 is connected to the DA converter DAC1 and setting voltage VR1 is inputted thereto.

The triangular wave oscillator O1 outputs a triangular wave signal. The triangular wave signal vibrates in a specified voltage range (for example, 1.0 V-2.0 V). The triangular wave oscillator O1 is constituted of for example, OP amplifier, resistor, capacitor and the like.

The PWM comparator PWM1 has a plus side input terminal (+) and a minus side input terminal (−). This plus side input terminal (+) is connected to the output terminal (N1) of the error amplifier EA1. On the other hand, the minus side input terminal (−) is connected to the triangular wave oscillator O1. Further, the output terminal (Q1) of the PWM comparator PWML is connected to the gate of the main switching transistor T11 and the non-inverting output terminal (*Q1) of the PWM comparator PWM1 is connected to the gate of the synchronous switching transistor T12.

The structures of the second to fourth DC-DC converters 40-60 are the same as that of the first DC-DC converter 30. Error amplifiers EA2-EA4 are provided instead of the error amplifier EA1 of the first DC-DC converter 30 and setting voltages VR2-VR4 are inputted to each non-inverting input terminal. Further, PWM comparators PWM2-PWM4 are provided instead of the PWM comparator PWM1, main switching transistors T21-T41 are provided instead of the main switching transistor T11, synchronous side switching transistors T22-T42 are provided instead of the synchronous side switching transistor T12, choke coils L2-L4 are provided instead of the choke coil L1 and capacitors C2-C4 are provided instead of the capacitor C1.

The other ends of the choke coils L2-L4 are output terminals, which output the low level side power supply voltage VSS, the reference voltage Vref and the back gate voltage VBGP of the PMOS transistor.

The structure of the fifth DC-DC converter 70 for outputting the back gate voltage VBGN of the NMOS transistor which is a negative voltage includes an error amplifier EA5, triangular wave oscillator O5, PWM comparator PWM5, main switching transistor T51, synchronous side switching transistor T52, choke coil L5 and capacitor C5 like the first-fourth DC-DC converters 30-60.

To output a negative voltage, the synchronous side switching transistor T52 and the capacitor C5 are connected to the output terminal instead of the ground different from the first-fourth DC-DC converters 30-60. The choke coil L5 is connected to the ground instead of the output terminal. An inverting amplifier INV is provided between the output terminal and the inverting input terminal of the error amplifier EA5, so that the output voltage is inverted and fed back to the inverting input terminal of the error amplifier EA5.

The interface control portion IF corresponds to communication portion.

Next, the control method of the power supply unit 1 will be described. The interface control portion IF receives the first voltage setting information from the external unit 2 connected to the IIC bus. The first voltage setting information received by the interface control portion IF is stored in the registers REGa-REGd for each of the DC-DC converters. The first voltage setting information sent from the external unit is expressed by a difference of potential to the low level side power supply voltage because it is information expressing a logical voltage value. That is, it is information indicating a voltage value to the ground. Therefore, if the low level side power supply voltage VSS is different from the ground, it coincides with the real voltage information indicating an actual voltage value and the first voltage setting information is not send. Accordingly, the registers REGa-REGd are so constructed in a quantity smaller by one than the number of the DC-DC converters. The reason is that the first voltage setting information relating to the low level side power supply voltage VSS does not need to be sent because the first voltage setting information adopts the low level side power supply voltage VSS as the ground level.

The first voltage setting information stored in the registers REGa-REGd is information for setting output voltages such as power supply voltage, reference voltage, back gate voltage of PMOS transistor, back gate voltage of NMOS transistor. That information includes specified value information of the output voltage, output voltage adjustment magnification information, output voltage offset value information, specified value information of particular voltage, adjustment value information of particular voltage and the like.

The particular voltage mentioned here is a voltage relating to the output voltage outputted from the power supply unit 1, which compares a logical voltage value (specified value) given nominally and provisionally with an actually outputted voltage value (adjustment value). For example, the threshold voltage is an example of the particular voltage. If the control LSI 100 is considered independently in FIG. 7, the threshold voltage is 0.6 V, which is a voltage ½ the power supply voltage (1.2 V). This is a specified value of the particular voltage. In interfacing shown in FIG. 7, the threshold voltage needs to meet the terminal voltage VTT (1.25 V). This is an adjustment value of the particular voltage.

The first voltage setting information stored in each register REGa-REGd is digital signal indicating information of logical voltage value or digital signal indicating code information corresponding to the real voltage information of a voltage value to be outputted.

The voltage adjusting portion AD adjusts the real voltage information which is information of the voltage value to be outputted from the first-fifth DC-DC converters 30-70 based on the first voltage setting information stored in the registers REGa-REGd. The adjusted real voltage information is stored in the registers REG1-REG5 for each of the first-fifth DC-DC converters 30-70. The real voltage information stored in the registers REG1-REG5 is digital signal. These digital signals are converted to analog values in the DA converters DAC1-DAC5. The converted analog signals are inputted to the non-inverting input terminals of the error amplifiers EA1-EA5 as the setting voltages VR1-VR5 of the first-fifth DC-DC converters 30-70.

The output voltages of the first-fifth DC-DC converters 30-70 are fed back to the inverting input terminals of the error amplifiers EA1-EA5. A differential voltage of the high level side power supply voltage VDD to the setting voltage VR1, a differential voltage of the low level side power supply voltage VSS to the setting voltage VR2, a differential voltage of the reference voltage Vref to the setting voltage VR3, a differential voltage of the back gate voltage VBGP to the setting voltage VR4 and a differential voltage of inverted back gate voltage VBGN to the setting voltage VR5 are error-amplified. The error output voltages outputted from the output terminals (N1)-(N5) are inputted to the plus side input terminals (+) of the PWM comparators PWM1-PWM5.

Triangular waves signal from the triangular wave oscillators O1-O5 are inputted to the minus side input terminals (−) of the PWM comparators PWM1-PWM5. The PWM comparators PWM1-PWM5 compare the error output voltage with the voltage value of the triangular wave signal.

When the error output voltage is larger than the voltage value of the triangular wave signal, the PWM comparators PWM1-PWM5 output high level PWM signal from the output terminals (Q1)-(Q5). At the same time, low level inverted PWM signals are outputted from the inverted output terminals (*Q1)-(*Q5). When the error output voltage is smaller than the voltage value of the triangular wave signal, the PWM comparators PWM1-PWM5 output low level PWM signals from the output terminals (Q1)-(Q5). At the same time, high level inverted PWM signals are outputted from the inverted output terminals (*Q1)-(*Q5).

The PWM signal is inputted to the gate of the main switching transistors T11-T51. The main switching transistors T11-

T51 are turned on when the PWM signal is of high level and turned off when the PWM signal is of low level. The inverted PWM signal is inputted to the gate of the synchronous side switching transistors T12-T52. The synchronous side switching transistors T12-T52 are turned off when the inverted PWM signal is of low level and turned on when it is of high level. The output voltages (VDD, VSS, Vref, VBGP VBGN) are controlled to meet the setting voltages VR1-VR5 because the PWM signal changes repeatedly between high level and low level and at the same time, the inverted PWM signal changes repeatedly between the low level and high level. The output voltage is a voltage value having a polarity opposite to the setting voltage VR5.

The first voltage setting information sent by the IIC bus is stored in the registers REGa-REGd. The first voltage setting information stored in the registers REGa-REGd is adjusted to the real voltage information by the voltage adjusting portion AD and after that, stored in the registers REG1-REG5. The real voltage information outputted from the registers REG1-REG5 can control each output voltage to a target voltage value as the setting voltages VR1-VR5 for setting the output voltage (VDD, VSS, Vref, VBGP, VBGN) of the first-fifth DC-DC converters 30-70. The first voltage setting information can be adjusted to optimum real voltage information by the voltage adjusting portion AD whatever the first voltage setting information is.

Figure 3:
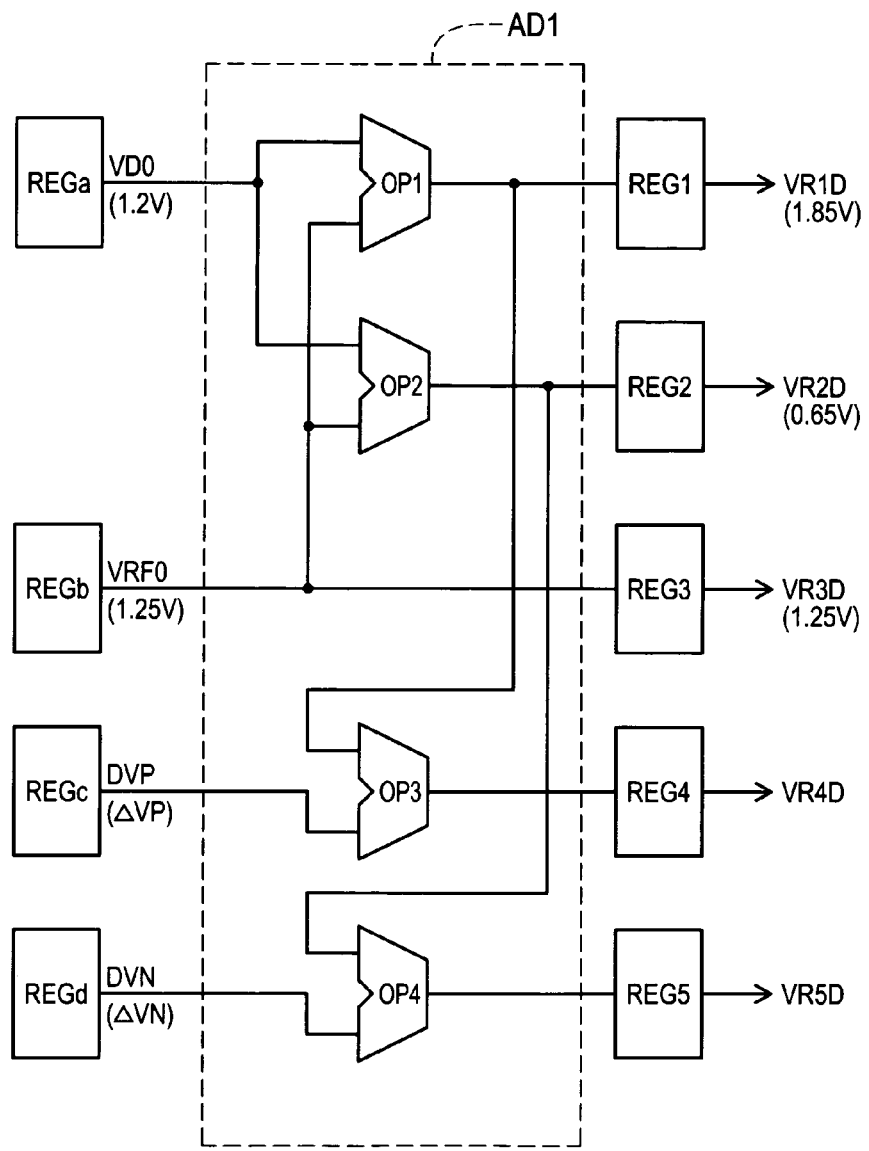
FIG. 3 is a diagram showing a voltage adjusting portion of a first embodiment.

FIG. 3 is a circuit block diagram of the voltage adjusting portion AD1 applied to the first embodiment. The principle diagram of FIG. 2 shows an embodiment of the voltage adjusting portion AD. In the first embodiment, the power supply unit 1 will be described as a unit for supplying electricity to the control LSI100 which constitutes the interface shown in FIG. 7.

In the control LSI 100 of FIG. 7, the nominal power supply voltage when the low level side power supply voltage acts as the ground is assumed to be, for example, 1.2 V. The power supply voltage information VD0 is stored in the register REGa having information of a voltage value of 1.2 V. In case of the back gate of the PMOS/NMOS transistor, it is assumed that a ΔVP higher voltage is applied to the back gate of the PMOS transistor from the high level side power supply voltage in order to ensure a back gate effect and that a ΔVN lower voltage is applied from the ground to the NMOS transistor. The back gate effect voltage information DVP of the PMOS transistor is stored in the register REGc having information of the voltage value of ΔVP. The back gate effect voltage information DVN of the NMOS transistor is stored in the register REGd having information of the voltage value of Δ VN. The terminal voltage VTT of the interface signal is set to, for example, 1.25 V. The threshold voltage of the control LSI 100 needs to meet the terminal voltage VTT. The reference voltage information VRF0 is stored in the register REGb having information of the voltage of 1.25 V.

The operation to be conducted in an operating portion OP1 aims at obtaining real high level side power supply voltage information VR1D for setting physical high level side power supply voltage VDD outputted from the power supply unit 1 from the power supply voltage information VD0 and the reference voltage information VRF0. To make the logic threshold voltage of the control LSI100 agree the terminal voltage VTT (1.25 V), the real high level side power supply voltage information VR1D representing physical high level side power supply voltage VDD is computed by adding ½ the power supply voltage information VD0 to the reference voltage information VRF0.

It comes that VR1D 32 VD0/2+VRF0. As a value of the high level side power supply voltage VDD, 1.2V/2+1.25V=1.85V is outputted.

The operating portion OP1 is constituted of a divider and an adder. According to the first embodiment, the divider divides by 2. The digital operation can be achieved simply by bit shift action of 1 bit. The digital operation in case of the adder can be achieved easily with a known circuit configuration.

The operation conducted by the operating portion OP2 aims at obtaining the real low level side power supply voltage information VR2D for setting the physical low level side power supply voltage VSS outputted from the power supply unit 1 based on the power supply voltage information VD0 and the reference voltage information VRF0. Like in the operating portion OP1, the real low level side power supply voltage information VR2D representing the physical low level side power supply voltage VSS is computed by subtracting ½ the power supply voltage information VD0 from the reference voltage information VRF0.

It comes that VR2D=VRF0−VD0/2.

As a value of the low level side power supply voltage VSS, 1.25 V−1.2 V/2=0.65 V is outputted.

The operating portion OP2 is constituted of a divider and a subtractor. Like in the operating portion OP1, the divider can achieve the digital operation easily by a bit shift action of 1 bit. Further, the digital operation in case of the substractor can be achieved easily with a known circuit configuration.

The operation conducted by the operating portion OP3 aims at obtaining the real PMOS back gate voltage information VR4D for setting physical back gate voltage VBGP which is outputted from the power supply unit 1 and exerts the back gate effect of the PMOS transistor by adding the back gate effect voltage information DVP of the PMOS transistor to the real high level side power supply voltage information VR1D. Likewise, the operation conducted by the operating portion OP4 aims at obtaining real NMOS back gate voltage information VR5D for setting the physical back gate voltage VBGN which is outputted from the power supply unit 1 and exerts the back gate effect of the NMOS transistor by subtracting the back gate effect voltage information DVN of the NMOS transistor from the real low level side power supply voltage information VR2D. These operations are expressed in following equations.

$$VR4D=VR1+DVP$$

$$VR5D=VR2-DVN$$

As a value of the back gate voltage VBGP of the PMOS transistor, 1.85 V+ΔVP is outputted and as the back gate voltage VBGN of the NMOS transistor, 0.65 V−ΔVN is outputted.

The operating portions OP3 and OP4 are constituted of an adder and a subtractor respectively. The digital operations can be achieved easily with a known circuit configuration.

In the first embodiment, as described above, the real voltage information can be adjusted by computing the first voltage setting information with the operating portions OP1-OP4. In the meantime, the reference voltage information VRF0 is stored in the register REG3 as the real reference voltage information VR3D. The voltage value indicated by the real reference voltage information VR3D is 1.25V which is equal to the voltage value indicated by the reference voltage information VRF0.

Here, the power supply voltage information VD0 is an example of the specified value information of the output voltage and the back gate effect voltage information DVP, DVN of the PMOS/NMOS transistor is an example of the output voltage offset value information. The real P/NMOS back gate voltage information VR4D, VR5D can be obtained by adding or subtracting the back gate effect voltage information DVP, DVN which is the output voltage offset value information to the real high level side/low level side power supply voltage information VR1D, VR2D. Further, the reference voltage value information VRF0 is an example of the adjustment value information of a particular voltage.

If information indicating a voltage value (0.6 V) which is ½ the voltage value (1.2 V) indicated by the power supply voltage value information VD0 is specified value information of a particular voltage, differential offset value information can be obtained by subtracting the specified value information of the particular voltage from the reference voltage value information VRF0 which is adjustment value information of the particular voltage using a subtracter and then the real voltage information can be adjusted by adding the differential offset value information to the specified value information of the output voltage such as the power supply voltage value information VD0. The voltage value indicated by the differential offset value information in this case is 1.25 V−0.6 V=0.65 V. Needless to say, this voltage value coincides with the low level side power supply voltage VSS. In the first embodiment, a shift from the ground to the low level side power supply voltage VSS corresponds to a voltage value shifted by the differential offset value information. According to the first embodiment, the real voltage information is adjusted by operation by the operating portions OP1-OP4 instead of this operation.

Although in the first embodiment, a case where an object to undergo addition or subtraction of the output voltage offset value information is real high level side/low level side power supply voltage value information VR1D/VR2D has been described, the present invention is not restricted to this example but a structure in which the first voltage setting information undergoes addition or subtraction may be adopted. Further, the real high level side power supply information VR1D, the real low level side power supply voltage information VR2D, the real reference voltage information VR3D, the real PMOS back gate voltage information VR4D and the real NMOS back gate voltage information VR5D are an example of the real voltage information.

Needless to say, the operating portions OP1-OP4 and other operations can be achieved in hardware viewpoints with a known circuit configuration or in software viewpoints using known operation routine.

Figure 4:
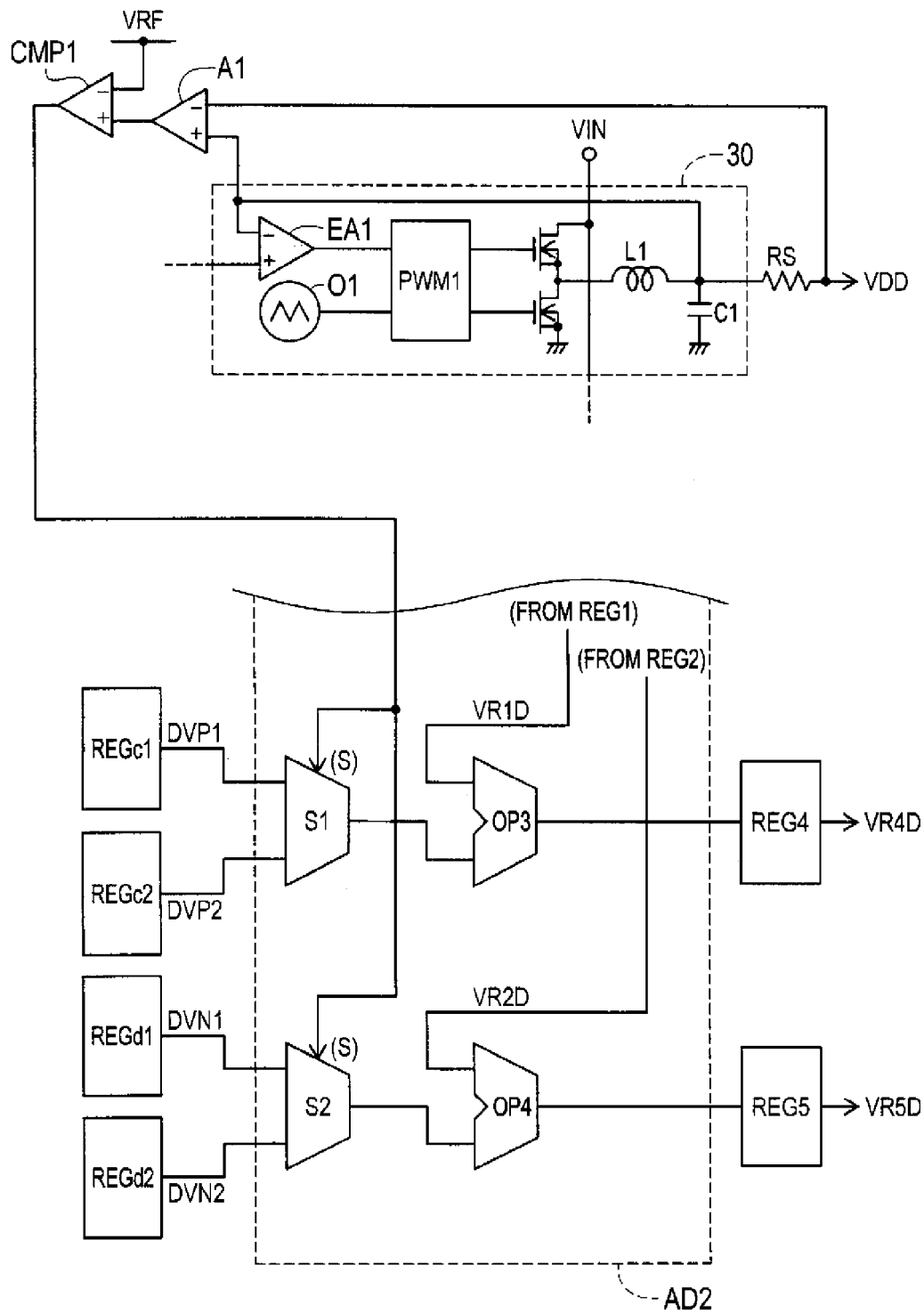
FIG. 4 is a diagram showing a second embodiment.

FIG. 4 is a circuit block diagram showing a second embodiment. The second embodiment includes an amplifier A1 and a comparator CMP1 and further a voltage adjusting portion AD2 having selectors S1 and S2 additionally. In a first DC-DC converter 30, a sense resistor RS is provided on a current passage on the output side relative to a connection point between the choke coil L1 and the capacitor C1. The amplifier A1 is connected to both ends of the sense resistor RS. The connecting point between the choke coil L1 and the capacitor C1 is connected to a non-inverting input terminal of the amplifier A1 while its output side is connected to an inverting input terminal and the amplifier A1 amplifies an output current converted to a voltage with the sense resistor RS. The output terminal of the amplifier A1 is connected to the non-inverting input terminal of the comparator CMP1. The inverting input terminal of the comparator CMP1 is connected to the reference voltage VRF. The output terminal of the comparator CMP1 is connected to selective terminals (S) of selectors S1 and S2.

Here, the high level side power supply voltage VDD corresponds to the first output voltage. The amplifier A1 corresponds to a buffer portion and the selectors S1 and S2 and registers REGc1, REGc2, REGd1, and REGd2 correspond to the selecting portion. The reference voltage VRF corresponds to a reference value. Further, the sense resistor RS and amplifier A1 correspond to a detecting portion of the power supply unit. The provision of the comparator CMP1, selectors S1 and S2 and registers REGc1, REGc2, REGd1, and REGd2 correspond to a voltage changing portion. The amplifier A1 corresponds to the detecting portion in the control circuit of the power supply unit.

The selector S1 selects any one of the registers REGc1 and REGc2 and is connected to an operating portion OP3 instead of the register REGc of the first embodiment. The other terminal of the operating portion OP3 is connected to the register REG1. The selector S2 selects any one of the registers REGd1 and REGd2 and is connected to an operating portion OP4 instead of the register REGd. The other terminal of the operating portion OP4 is connected to the register REG2.

The registers REGc1 and REGc2 store the back gate effect voltage value information DVP1 and DVP2 each having different voltage value information to be added to the real high level side power supply voltage information VR1D for adjusting the real PMOS back gate voltage information vR4D which sets up the physical back gate voltage VBGP of the PMOS transistor. Likewise, the registers REGd1 and REGd2 store the back gate effect voltage value information DVN1 and DVN2 each having different voltage value information to be subtracted from the real low level side power supply voltage information VR2D for adjusting the real NMOS back gate voltage information VR5D which sets up the physical back gate voltage VBGN of the NMOS transistor. Assume that the relation of the voltage values indicated by each information is DVP1>DVP2, DVN1>DVN2. When the back gate effect voltage value information DVP1, DVN1 is selected, the real P/NMOS back gate voltage information VR4D, VR5D which exerts a larger back gate effect is adjusted.

In the MOS transistor, the threshold voltage shallows if the back gate effect is decreased. The operating velocity accompanying current drive capacity is improved although leak current increases. Conversely, the threshold voltage deepens if the back gate effect is increased. The leak current is reduced although the operating velocity accompanying the current drive capacity is limited. If a semiconductor device constituted of MOS transistor is activated, it is preferable to shallow the threshold voltage by decreasing the back gate effect and in case of standby state in which the semiconductor device is not activated, it is preferable to deepen the threshold voltage by increasing the back gate effect.

According to the second embodiment shown in FIG. 4, the actuation state of the semiconductor device is detected depending on the quantity of output current flowing to the high level side power supply voltage VDD. If the output current is small and the output voltage amplified by the amplifier A1 drops below the reference voltage VRF when the semiconductor device is in the standby state, the output voltage of the comparator CMP1 turns to low level. If the selectors S1 and S2 are set to select the registers REGc1, REGd1 at this time, larger voltage value signals DVP1 and DVN1 are selected, thereby producing a larger back gate effect. Consequently, the threshold voltage can be set deep to reduce a leak current in the standby state.

When the semiconductor device is activated and the output current flows, the output voltage of the comparator CMP1 turns to high level if the output current increases to exceed the reference voltage VRF under a output voltage from the amplifier A1. Consequently, the selectors S1 and S2 select the registers REGc2 and REGd2 and thus smaller voltage value signals DVP2 and DVN2 are selected, thereby producing a smaller back gate effect. Consequently, the threshold voltage can be set shallow to improve the operating velocity.

Figure 5:
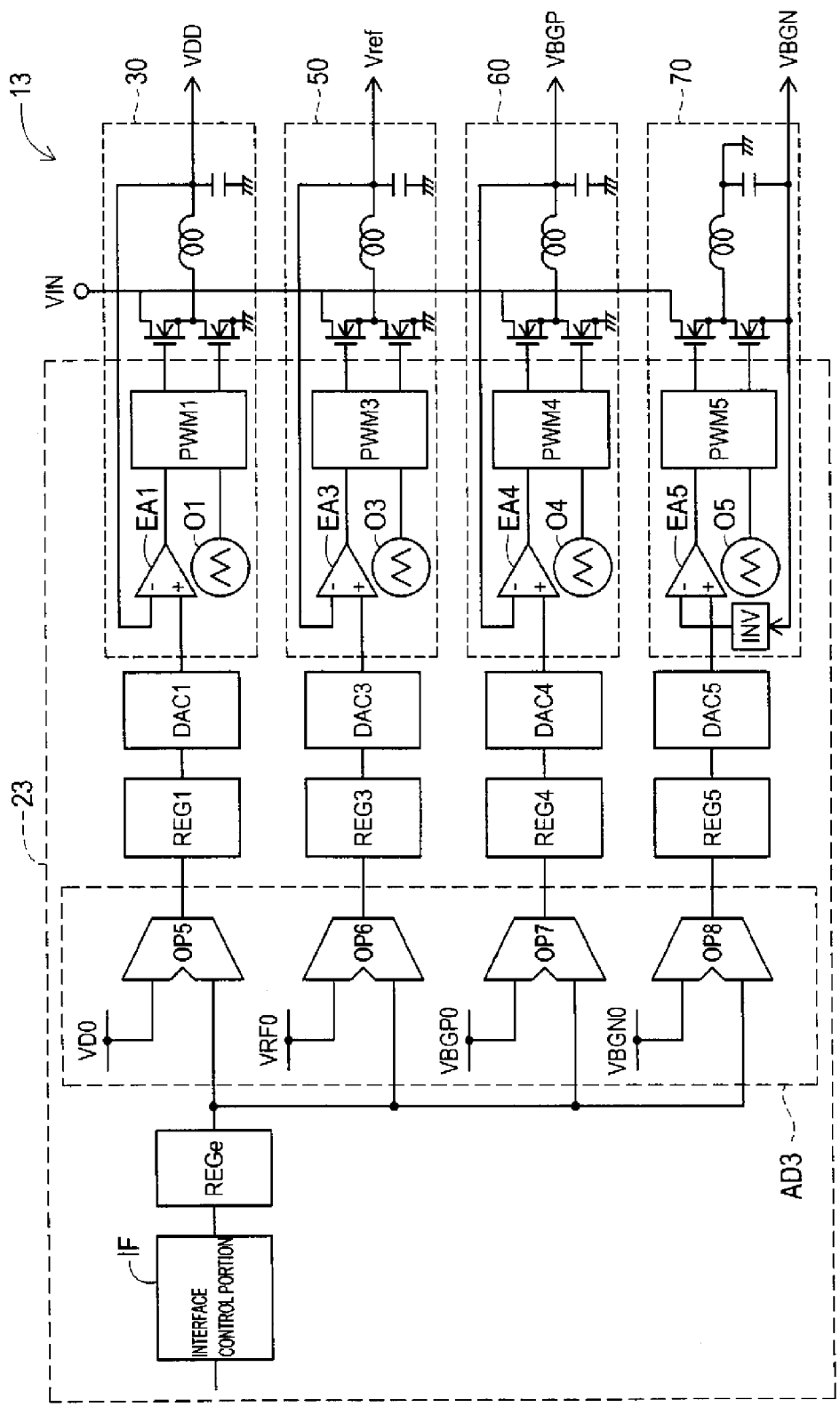
FIG. 5 is a diagram showing a third embodiment.

FIG. 5 is a circuit block diagram showing a power supply unit 13 and a control circuit 23 of the power supply unit 13 according to a third embodiment. The third embodiment is not provided with the second DC-DC converter 40 which outputs a low level side power supply voltage VSS. The third embodiment includes a register REGe instead of the registers REGa-REGd and further a voltage adjusting portion AD3. In this case, the low level side power supply voltage VSS is maintained at the same potential as the ground and other voltage values are generated using output voltage adjustment magnification information. For example, the specified value information of the output voltage is adjusted with a predetermined magnification information of 0.9 times or 1.1 times.

The voltage adjusting portion AD3 includes operating portions OP5-OP8 and the register REGe is connected to the respective operating portions OP5-OP8, voltage value information (VD0, VDF0, VBGP0, VBGN0) indicating a logic voltage value as specified value information of a preliminarily set output voltage is connected thereto. Here, voltage value information VD0 indicates specified value information of power supply voltage, voltage value information VRF0 indicates specified value information of reference voltage, voltage value information VBGP0 indicates specified value information of back gate voltage of the PMOS transistor and voltage value information VBGN0 indicates specified value information of back gate voltage of the NMOS transistor.

Output voltage adjustment magnification information is stored in the register REGe. It is considered that the specified value information of the output voltage is adjusted with predetermined magnification information when an external device 2 or the like to be supplied with power is adjusted to an optimum voltage value corresponding to dispersion of manufacturing quality or a combination of individual device. In this case, the output voltage adjustment magnification information sent from the external device 2 or the like is stored.

The operating portions OP5-OP8 are multipliers. Voltage value information (VD0, VRF0, VBGP0, VBGN0) indicating a predetermined logical voltage value is multiplied with output voltage adjustment magnification information stored in the register REGe. In this case, the multiplier can be achieved easily with a known circuit configuration or known software in fields of digital operation.

The predetermined voltage value information (VD0, VRF0, VBGP0, VBGN0) corresponds to the second voltage setting information. The output voltage adjustment magnification information may be predetermined second voltage setting information and the voltage value information (VD0, VRF0, VBGP0, VBGN0) may be set to be sent from outside.

The third embodiment shown in FIG. 5 can be applied to a case where the ground of the external device 2 is unchangeable and a variety of voltages specified with reference to the ground is adjusted at a predetermined magnification. If the output voltage adjustment magnification information to the specified value information of the output voltage is sent from outside when each external device 2 needs to be supplied with voltage by adjusting the voltage value individually, the voltage value can be outputted to each external device 2 corresponding to the real voltage information adjusted with respect to the specified value information of the output voltage.

Figure 6:
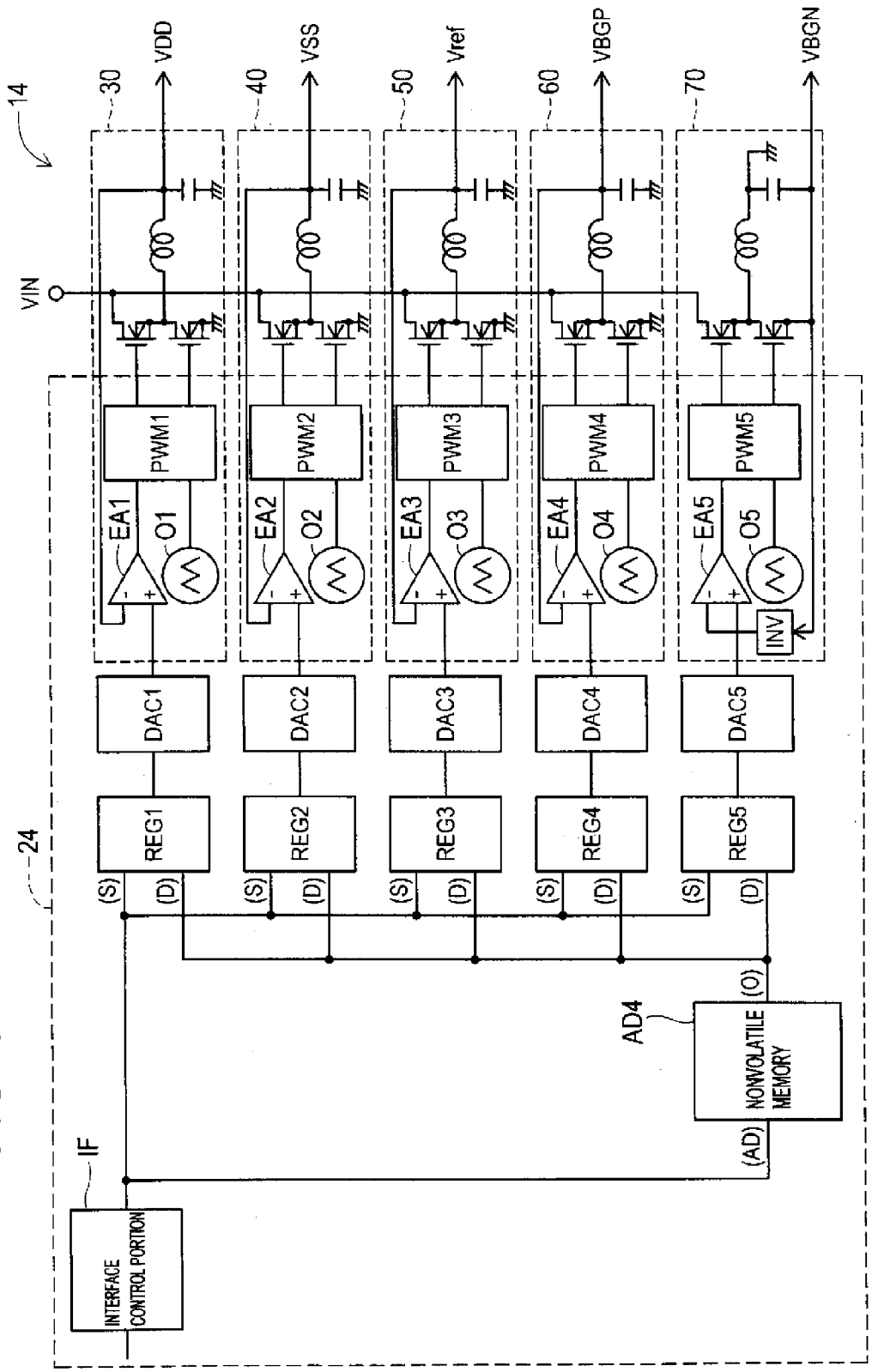
FIG. 6 is a diagram showing a fourth embodiment.

FIG. 6 is a circuit block diagram showing a power supply unit 14 and a control circuit 24 of the power supply unit 14 according to the fourth embodiment. The fourth embodiment meets a case where the first voltage setting information is sent as code information. This embodiment includes a nonvolatile memory AD4 as a voltage adjusting portion.

The code information from the interface control portion IF is inputted to an address terminal (AD) as an address signal of the nonvolatile memory AD4 and at the same time, inputted to selecting terminals (S) of the respective registers REG1-REG5 as a selective signal for selecting the registers REG1-REG5 which stores the real voltage information for first-fifth DC-DC converters 30-70. The output terminal (O) of the nonvolatile memory AD4 is connected to the data input terminals (D) of the respective registers REG1-REG5.

If the code information sent from outside, for example, the external device 2, is outputted from the interface control portion IF, the real voltage information stored in the nonvolatile memory AD4 is outputted to the output terminal (O) corresponding to the code information. The code information selects corresponding registers REG1-REG5 at the same time. Consequently, the real voltage information indicating physical voltage value outputted from the nonvolatile memory AD4 is stored in a corresponding register. A register storing the real voltage information corresponding to the code information can activate a corresponding DC-DC converter.

The sequence of storage of the real voltage information into the registers REG1-REG5 is determined corresponding to the input order of the code information. The first-fifth DC-DC converters 30-70 may be started after the storage into all the registers REG1-REG5 is completed. Further, a corresponding DC-DC converter may be started each time when the real voltage information is stored. In this case, the order of the code information outputted from the external device 2 needs to be determined corresponding to the circuit configuration of the external device 2 or a device configuration. In the fourth embodiment, it is necessary to pay attention to a rise-up order, for example, rise-up of the back gate voltages VBGP, VBGN and the reference voltage Vref after the high level side power supply voltage VDD and the low level side power supply voltage VSS are risen up in advance.

As described in detail above, the real voltage information is adjusted according to the specified value information of the output voltage, output voltage offset value information, specified value information of a particular voltage, adjustment value of a particular voltage or/and output voltage adjustment magnification information, inputted from outside as the first voltage setting information by the voltage adjusting portions AD, AD1, AD2, AD3, and AD4 in the control circuit of the power supply unit and the power supply unit according to this embodiment. Further, the real voltage information is adjusted corresponding to the specified value information of the output voltage, output voltage offset value information, specified value information of a particular voltage, adjustment value information of a particular voltage or/and the output voltage adjustment magnification information as the first voltage setting information, and the specified value information of the output voltage, output voltage offset value information, specified value information of a particular voltage, adjustment value information of a particular voltage or/and output voltage adjustment magnification information as the second voltage setting information. The output voltage of the power supply unit is controlled based on adjusted real voltage information.

According to the control method of the power supply unit of the embodiments, the specified value information of the output voltage, output voltage offset value information, specified value information of a particular voltage, adjustment value information of a particular voltage or/and output voltage adjustment magnification information are inputted as the first voltage setting information and then, the real voltage information is adjusted corresponding to the inputted specified value information of the output voltage, output voltage offset value information, specified value information of a particular voltage, adjustment value information of a particular voltage or/and output voltage adjustment magnification information. Alternatively, the specified value information of the output voltage, output voltage offset value information, specified value information of a particular voltage, adjustment value information of a particular voltage or/and output voltage adjustment magnification information are set up preliminarily as the second voltage setting information and then, the specified value information of the output voltage, output voltage offset value information, specified value information of a particular voltage, adjustment value information of a particular voltage or/and output voltage adjustment magnification information are inputted from outside to adjust the real voltage information. The output voltage of the power supply unit is controlled based on adjusted real voltage information.

As a consequence, if a voltage value set as an output voltage to a supply destination by the first voltage setting information or/and the second voltage setting information, inputted from outside or/and determined preliminarily is different from an actually necessary physical voltage value, a desired output voltage can be set up by adjusting the real voltage information flexibly.

The voltage value can be adjusted appropriately by providing a voltage value with an offset or/and by adjusting the voltage value according to a predetermined adjustment magnification corresponding to the circuit configuration of an electronic device represented by a semiconductor device or a system appliance constituted by combining the electronic devices or/and changes in operation characteristic due to dispersion of manufacturing quality or usage environment of the electronic device or system appliance. Thus, the operation of the appliance can be optimized.

The real voltage information indicating inherent physical voltage value necessary for each appliance can be adjusted from the voltage setting information. Necessity of inputting a voltage value inherent of each appliance does not exist and control upon the control circuit of the power supply unit or the power supply unit can be simplified.

Needless to say, the present invention is not restricted to the above-described embodiments but may be improved or modified in various ways within a scope not departing from the spirit of the invention.

Although a case where this embodiment includes the first-fifth DC-DC converters as a factor for constituting the power supply unit has been described, the present invention is not restricted to this example, but needless to say, the present invention can be applied to a linear regulator or other power supply unit. Additionally, the quantity of output voltages equipped on a power supply unit and the voltage value are not restricted to any particular ones.

The control circuit of the power supply unit and the power supply unit according to the present invention can be achieved on a semiconductor integrated circuit by semiconductor technology or on a module or a circuit board like a multi-chip module (MCP). Additionally, they can be achieved independently as a control circuit of a power supply unit or a power supply unit and further installed on other appliance.

The present invention can provide a control circuit of power supply unit, power supply unit and control method thereof capable of outputting a voltage value different from specified value information with the specified value information of output voltage as a reference.

What is claimed is:

1. A control circuit of power supply unit which controls a voltage value of output voltage corresponding to an instruction from an external unit, comprising:
    an interface control portion which receives first voltage setting information sent from the external unit through a communication line, the first voltage setting information being information on a first voltage difference between a high side and a low side in a supply voltage of a load; and
    a voltage adjusting portion which adjusts real voltage information based on the first voltage setting information and second voltage setting information which is information on a second voltage difference between a terminal and a ground voltage,
    wherein the voltage adjusting portion comprises an operating portion for executing operation between the first voltage setting information and the second voltage setting information,
    wherein the operating portion comprises an adding portion for adding half of the first voltage difference and the second voltage difference or a subtracting portion for subtracting half of the first voltage difference from the second voltage difference, and
    wherein the voltage value of the output voltage is controlled based on the real voltage information outputted from the voltage adjusting portion.

2. The control circuit of power supply unit according to claim 1 wherein the power supply unit outputs plural output voltages each having a different voltage value and includes:
    a voltage changing portion which detects an output current relating to a first output voltage which is one of the plural output voltages and changes at least one of the output voltages except the first output voltage based on detected changes of the output current.

3. The control circuit of power supply unit according to claim 2 wherein the voltage changing portion comprises:
    a detecting portion which detects the output current;
    a comparing portion which outputs a result of comparison of a detection value of the detecting portion with a reference value; and
    a selecting portion which selects the first or/and the second voltage setting information in order to adjust the real voltage information about the voltage value of at least one output voltage based on the result of comparison.

4. The control circuit of power supply unit according to claim 3 wherein the detecting portion includes a buffer portion which outputs the detection value after a value of the output current converted into a voltage is inputted therein.

5. The control circuit of power supply unit according to claim 1 wherein the first voltage setting information is code information corresponding to the voltage value of the output voltage, and
    wherein the voltage adjusting portion includes a conversion table in which the real voltage information is allocated to the code information.

6. The control circuit of power supply unit according to claim 5 wherein the voltage adjusting portion includes a nonvolatile memory portion which memorizes the conversion table and the code information is a signal corresponding to an address signal to the nonvolatile memory portion.

7. The control circuit of power supply unit according to claim 1 wherein the first voltage setting information and the second voltage setting information are digital signals.

8. The control circuit of power supply unit according to claim 5 further comprising a communication portion wherein the first voltage setting information is received by the communication portion.

9. A power supply unit in which a voltage value of output voltage is controlled corresponding to an instruction from an external unit, comprising:
- an interface control portion which receives first voltage setting information sent from the external unit through a communication line, the first voltage setting information being information on a first voltage difference between a high side and a low side in a supply voltage of a load; and
- a voltage adjusting portion which adjusts real voltage information based on the first voltage setting information and second voltage setting information which is information on a second voltage difference between a terminal voltage and a ground voltage,
- wherein the voltage adjusting portion comprises an operating portion for executing operation between the first voltage setting information and the second voltage setting information,
- wherein the operating portion comprises an adding portion for adding half of the first voltage difference and the second voltage difference or a subtracting portion subtracting half of the first voltage difference from the the second voltage difference, and
- wherein the voltage value of the output voltage is controlled based on the real voltage information outputted from the voltage adjusting portion.

10. The power supply unit according to claim 9 wherein the power supply unit outputs plural output voltages each having a different voltage value and further comprises a voltage changing portion which detects an output current relating to a first output voltage which is one of the plural output voltages and changes at least one of the output voltages except the first output voltage based on changes of the detected output current.

11. The supply unit according to claim 9 wherein the first voltage setting information is code information corresponding to the voltage value of the output voltage, and
- wherein the voltage adjusting portion includes a conversion table in which the real voltage information is allocated to the code information.

12. A control method of power supply unit for controlling a voltage value of output voltage corresponding to an instruction from an external unit, comprising:
- receiving first voltage setting information sent from the external unit through a communication line, the first voltage setting information being information on a first voltage difference between a high side and a low side in a supply voltage of a load;
- setting second voltage setting information which is information on a second voltage difference between a terminal voltage and a ground voltage; and
- adjusting real voltage information based on the first voltage setting information and the second voltage setting information,
- wherein the adjusting comprises executing operation between the first voltage setting information and the second voltage setting information,
- wherein the executing comprises adding half of the first voltage difference and the second voltage difference or subtracting half of the first voltage difference from the second voltage difference,and
- wherein the voltage value of the output voltage is controlled based on the real voltage information.

13. The control method of power supply unit according to claim 12 wherein the power supply unit outputs plural output voltages each having a different voltage value and the method further comprising detecting output current relating to a first output voltage which is one of the plural output voltages and changing at least one of the output voltages except the first output voltage based on detected changes of the output voltage.

14. The control method of power supply unit according to claim 12 further comprising relating code information to the real voltage information preliminarily, wherein
- the code information is inputted as the first voltage setting information and the real voltage information relating to the code information is outputted.

* * * * *